United States Patent
Kreiling et al.

(10) Patent No.: US 6,807,462 B2
(45) Date of Patent: Oct. 19, 2004

(54) SWITCHGEAR CABINET AIR CONDITIONING DEVICE

(76) Inventors: Jörg Kreiling, Grabenstr. 9, DE-35444 Bieberteil (DE); Michael Seelbach, Hinterm Schloss 9, DE-57258 Freudenberg (DE); Markus Hain, Holsteinstr. 1, DE-35684 Dillenburg (DE)

( * ) Notice: Subject to any disclaimer, the term of this patent is extended or adjusted under 35 U.S.C. 154(b) by 0 days.

(21) Appl. No.: 10/204,195
(22) PCT Filed: Feb. 6, 2001
(86) PCT No.: PCT/EP01/01247
§ 371 (c)(1),
(2), (4) Date: Nov. 18, 2002
(87) PCT Pub. No.: WO01/61808
PCT Pub. Date: Aug. 23, 2001

(65) Prior Publication Data
US 2003/0120392 A1 Jun. 26, 2003

(30) Foreign Application Priority Data
Feb. 17, 2000 (DE) .......................... 100 07 270

(51) Int. Cl.$^7$ .............................................. G05D 23/00
(52) U.S. Cl. ........................ 700/300; 165/80.2; 307/134
(58) Field of Search ..................... 700/300; 165/104.33, 165/80.3, 80.2; 312/236; 307/134

(56) References Cited

U.S. PATENT DOCUMENTS 6,041,851 A  *  3/2000  Diebel et al. .......... 165/104.33
6,222,448 B1 *  4/2001  Beck et al. .................. 340/3.1
6,348,745 B1 *  2/2002  Laurosch et al. ........... 307/112

FOREIGN PATENT DOCUMENTS

| CN | 1146645 A1 | * 10/2001 | .......... H03K/17/72 |
|---|---|---|---|
| DE | 196 15 469 A | 10/1997 | |
| DE | 196 09 651 C2 | 1/1998 | |
| DE | 197 10 019 A1 | 9/1998 | |
| JP | 11 191927 A | 10/1999 | |

OTHER PUBLICATIONS

Jürgen W. Hertel, "Offene Control–Systeme", Gebäudeautomation, Echelon GmbH, pp. 83–87, Apr. 1999.

Jürgen Kuri, "Das verkabelte Haus", Report Heimautomation, pp. 184–186, 188 and 190–192, 1999.

Buderus Heiztechnik, "Moderne Heizungskontrolle", GEBAUDEMANAGEMENT, p. 86, Aug. 1999.

* cited by examiner

Primary Examiner—Albert W. Paladini

(57) ABSTRACT

A switchgear cabinet air conditioning device having at least one cooling device, which has a cooling device control and a connected operating device. A simple operability is achieved because the operating device has a server which is assigned to the cooling device control, and has a network connection as well as at least one personal computer, which is connected via the network connection and via a universally accessible network and has an assigned web browser, by which the data retrieved from the server can be visually displayed.

20 Claims, 1 Drawing Sheet

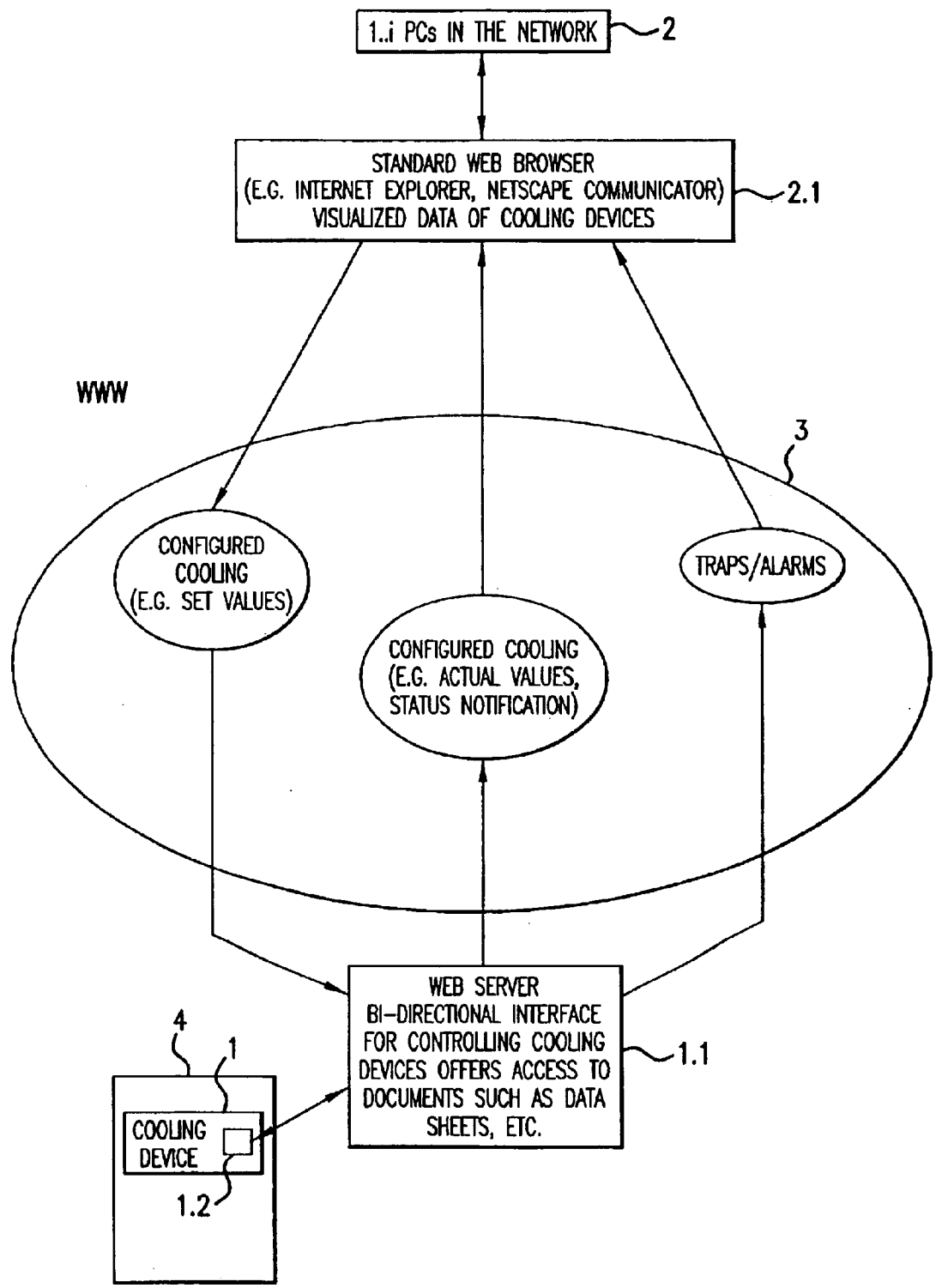

SWITCHGEAR CABINET AIR CONDITIONING DEVICE

The invention pertains to a switchgear cabinet air-conditioning device with at least one cooling device that contains a cooling device control and an operating device connected thereto.

A switchgear cabinet air-conditioning device of this type is described in DE 196 09 651. This known switchgear cabinet air-conditioning device contains, among other things, a cooling device that is connected to a cooling device control, wherein the cooling device control forms part of a central control unit that is also connected to other cooling components and sensor elements in order to realize an optimized control of the switchgear cabinet air-conditioning device with respect to its degree of efficiency or energy consumption. Current or voltage detectors may also be connected to the central control unit. This control unit makes it possible to realize various monitoring and control functions in order to ensure the most favorable operation of the air-conditioning device for the respective application. However, individual information and a corresponding operating expenditure are required in this type of operation that, in particular, is carried out on-site.

Another switchgear cabinet air-conditioning device with cooling devices and respectively assigned cooling device controls is known from DE 196 15 469 A1. In this case, the cooling device controls are connected to a network with a common bus link via respective interfaces. A personal computer for operating the cooling devices by outputting and inputting corresponding data is also connected to the bus. The respective cooling device controls are arranged in the form of a master/slave configuration in order to realize data exchange, with the cooling device controls requiring a corresponding adaptation and their connection to the network.

The invention is based on the objective of developing a switchgear cabinet air-conditioning device of the initially described type which can be easily installed and provides a high operating convenience.

This objective is attained with the characteristics of claim 1. According to these characteristics, the operating device comprises a server that is assigned to the cooling device control and a network connection, as well as at least one personal computer with an assigned web browser for visualizing the data retrieved from the server, wherein the personal computer is connected via the aforementioned network connection and via a universally accessible network.

The realization of the server that is connected to the cooling device control on one hand and to the universally accessible network on the other hand not only results in a standardized interface and accessibility by means of personal computers that can be arranged at arbitrary locations of the network, but also in a favorable design for transmitting data from the cooling device control and for converting the data for transmission via the network. Additional information that pertains to the cooling device and is stored in the server may be assigned to the data transmitted by the cooling device control in the server. The web browser not only makes it possible to clearly visualize and process the information retrieved from the server by means of a standardized connection to the network, but also to transmit appropriate instructions to the server and to the cooling device control via the server such that remote monitoring, a diagnosis of parameters and an adjustment or change of preset values can, for example, be realized via the internet, intranet, ethernet or a similar network.

In order to achieve a fast data exchange between the server and the cooling device control, the invention proposes that the server be bidirectionally connected to the cooling device control. The connection may, for example, consist of a bus connection on the same chip.

In one embodiment that is advantageous with respect to the design and the operation of the device, the software of the server and the cooling device control are loaded on a common computer that is integrated into the cooling device, wherein the computer contains personal computer components and can be operated as such.

The operating convenience for the user is improved due to the fact that documentation data regarding the design and/or operation of the cooling device are stored in the server. For example, exploded drawings and operating instructions may be stored as documentation data.

In order to easily access the information delivered by the cooling device control, the invention proposes that alarm data, status data, statistics data and temperature data supplied by the cooling device control can be stored in the server. Operating sequences for influencing the operating mode of the cooling device control can also be stored in the server in the form of a program, wherein changes can be made from the personal computer.

The data processing may be realized with the aid of a data processing stage in the server.

The processing and, for example, preselecting of the data can also be realized by providing an evaluation stage for at least partially evaluating and/or pre-processing acquired data in the cooling device control.

Simple operation is also attained due to the fact that the server and/or the cooling device control can be configured via the network by means of the personal computer.

The data transmission can be advantageously realized in such a way that digital data present in the cooling device control are transmitted to the server upon a request by the server.

In one advantageous embodiment for forwarding important data for the respective application, the cooling device control is designed, programmed or programmable in such a way that it automatically delivers to the server data which are recognized as being important based on differentiation criteria that are or can be predetermined in the cooling device control.

The control and monitoring functions are broadened due to the fact that a management device which is based on software is assigned to the server, wherein at least one switchgear cabinet monitoring and control device for acquiring additional status data of the switchgear cabinet—delivered by the cooling device control—is or can be connected to said management device.

The arrangement may be realized in such a way that the cooling device control is or can be connected to the management device via an assigned switchgear cabinet monitoring and control device.

The cooling device control may be equipped with devices for monitoring the current consumption of the fan and the compressor, the temperature, icing, the cooling performance, high/low pressure and the phase relation. In order to also make it possible to easily monitor and configure the air-conditioning control on-site by maintenance personnel, it would be conceivable to store operating parameters and error messages in the control. The control can be realized with the aid of a conventional interface with control switches, wherein the display is realized on a simple monitor or a 7-segment display. In addition, an interface with a local bus may also be provided.

One embodiment of the invention is described in greater detail below with reference to the FIGURE.

The FIGURE shows a switchgear cabinet air-conditioning device 4 with a cooling device 1 that has a cooling device control, wherein the cooling device control 1.2 can bidirectionally exchange data with a network server 1.1, for example, on a common microcontroller. The server 1.1 is designed for being connected to a universally accessible network 3, for example an internet, intranet or ethernet. The network 3 makes it possible for the server 1.1 to exchange data with a computer terminal arranged at an arbitrary location, in particular, a personal-computer 2 with a standardized web browser 2.1.

For example, the server 1.1 and/or the cooling device control 1.2 can be easily configured from the personal computers 2 due to the clear visualization realized by the web browser 2.1. In this case, preset values can be adjusted, changed or deleted, and programs for operating sequences or data processing which are stored in the server 1.1 can be changed or supplemented. It is also possible to input new programs. Data and information stored in the server 1.1, in particular, monitoring data transmitted by the cooling device control 1.2 or documents pertaining to the design and the operation of the cooling device 1 which are stored in the server 1.1, as well as status data of the cooling device 1, other status messages and actual values, can be retrieved by the personal computer 2 or, if the data are determined to be important, automatically transmitted from the server 1.1 to the personal-computer 2. The web browser 2.1 assigned to the personal-computer 2 makes it possible to clearly visualize all data transmitted by the server 1.1. However, it is also possible to assign updated values transmitted by the cooling device control 1.2 to information stored in the server 1.1 and to commonly visualize the information on the personal-computer 2 with the aid of the web browser 2.1.

Because it is possible to use standard connections with an universally accessible network and data transmission protocols that are also commonly available, the installation expenditures are low and the operation can be easily carried out by unskilled personnel. The basic protocol, for example, is of a TCP/IP protocol (Transition Control Protocol/Internet Protocol). The connection may, for example, be provided by an ethernet interface. An automated output of messages under impermissible operating conditions can be realized with an SNMP (Simple Network Management Protocol, basic TCP/IP and ethernet).

Specific parameters and data, for example a replacement parts list, technical ratings, exploded drawings, and the like, may be stored in the server 1.1 of the cooling device 1. After evaluated and graphically processed, the stored operating parameters or error messages are stored in the server 1.1 and can, in part, also be stored in the cooling device control 1.2.

What is claimed is:

1. In a switchgear cabinet air-conditioning device (4) having at least one cooling device (1) that contains a cooling device control (1.2) and an operating device that is connected to the cooling device control (1.2) and having at least one personal computer (2), the improvement comprising: the operating device containing a server (1.1) assigned to the cooling device control (1.2) and bidirectionally connected to the cooling device control (1.2), the server (1.1) having a network connection connected to a universally accessible network (3), and the personal computer (2) connected via the network connection and via the universally accessible network (3) and having an assigned web browser (2.1) for obtaining data retrieved from the server (1.1).

2. In the switchgear cabinet air-conditioning device (4) according to claim 1, wherein software of the server (1.1) and of the cooling device control (1.2) are loaded on a common computer that is integrated into the cooling device (1), and the computer has a personal computer component.

3. In the switchgear cabinet air-conditioning device (4) according to claim 2, wherein documentation data regarding a design of at least one of the cooling device (1) and an operation of the cooling device (1) each is stored in the server (1.1).

4. In the switchgear cabinet air-conditioning device (4) according to claim 3, wherein an alarm data, a status data, a statistics data and a temperature data supplied by the cooling device control (1.2) are stored in the server (1.1).

5. In the switchgear cabinet air-conditioning device (4) according to claim 4, wherein a data processing stage is in the server (1.1).

6. In the switchgear cabinet air-conditioning device (4) according to claim 5, wherein an evaluation stage for at least one of partially evaluating and pre-processing acquired data is in the cooling device control (1.2).

7. In the switchgear cabinet air-conditioning device (4) according to claim 6, wherein at least one of the server (1.1) and the cooling device control (1.2) each is configured via the network (3) by the personal computer (2).

8. In the switchgear cabinet air-conditioning device (4) according to claim 7, wherein digital data present in the cooling device control (1.2) are transmitted to the server (1.1) upon a request by the server (1.1).

9. In the switchgear cabinet air-conditioning device (4) according to claim 8, wherein the cooling device control (1.2) automatically delivers to the server (1.1) data recognized as important based on a differentiation criteria predetermined in the cooling device (1).

10. In the switchgear cabinet air-conditioning device (4) according to claim 9, wherein a management device based on software is assigned to the server (1.1), and at least one switchgear cabinet monitoring and control device for acquiring additional status data of the switchgear cabinet is connectible to the management device.

11. In the switchgear cabinet air-conditioning device (4) according to claim 10, wherein the cooling device control (1.2) is connectible to the management device by an assigned switchgear cabinet monitoring and control device.

12. In the switchgear cabinet air-conditioning device (4) according to claim 1, wherein documentation data regarding a design of at least one of the cooling device (1) and an operation of the cooling device (1) each is stored in the server (1.1).

13. In the switchgear cabinet air-conditioning device (4) according to claim 1, wherein an alarm data, a status data, a statistics data and a temperature data supplied by the cooling device control (1.2) are stored in the server (1.1).

14. In the switchgear cabinet air-conditioning device (4) according to claim 1, wherein a data processing stage is in the server (1.1).

15. In the switchgear cabinet air-conditioning device (4) according to claim 1, wherein an evaluation stage for at least one of partially evaluating and pre-processing acquired data is in the cooling device control (1.2).

16. In the switchgear cabinet air-conditioning device (4) according to claim 1, wherein at least one of the server (1.1) and the cooling device control (1.2) each is configured via the network (3) by the personal computer (2).

17. In the switchgear cabinet air-conditioning device (4) according to claim 1, wherein digital data present in the cooling device control (1.2) are transmitted to the server (1.1) upon a request by the server (1.1).

18. In the switchgear cabinet air-conditioning device (4) according to claim 1, wherein the cooling device control (1.2) automatically delivers to the server (1.1) data recognized as important based on a differentiation criteria predetermined in the cooling device (1).

19. In the switchgear cabinet air-conditioning device (4) according to claim 1, wherein a management device based on software is assigned to the server (1.1), and at least one switchgear cabinet monitoring and control device for acquiring additional status data of the switchgear cabinet is connectible to the management device.

20. In the switchgear cabinet air-conditioning device (4) according to claim 19, wherein the cooling device control is connectible to the management device by an assigned switchgear cabinet monitoring and control device.

* * * * *

UNITED STATES PATENT AND TRADEMARK OFFICE
CERTIFICATE OF CORRECTION

PATENT NO.    : 6,807,462 B2
DATED         : October 19, 2004
INVENTOR(S)   : Jorg Kreiling et al.

It is certified that error appears in the above-identified patent and that said Letters Patent is hereby corrected as shown below:

<u>Title page,</u>
Insert Item -- [73] Assignee: Rittal GmbH & Co., KG, Herborn (DE) --

Signed and Sealed this

Third Day of May, 2005

JON W. DUDAS
*Director of the United States Patent and Trademark Office*